（12）United States Patent
Grejda et al.

(10) Patent No.: US 8,922,750 B2
(45) Date of Patent: Dec. 30, 2014

(54) MAGNIFICATION CONTROL FOR LITHOGRAPHIC IMAGING SYSTEM

(75) Inventors: Robert D. Grejda, Fairport, NY (US); Paul Francis Michaloski, Rochester, NY (US)

(73) Assignee: Corning Incorporated, Corning, NY (US)

( * ) Notice: Subject to any disclaimer, the term of this patent is extended or adjusted under 35 U.S.C. 154(b) by 1034 days.

(21) Appl. No.: 12/908,392

(22) Filed: Oct. 20, 2010

(65) Prior Publication Data
US 2011/0122383 A1 May 26, 2011

Related U.S. Application Data

(60) Provisional application No. 61/263,178, filed on Nov. 20, 2009.

(51) Int. Cl.
*G03F 7/20* (2006.01)
*G02B 27/00* (2006.01)
*G02B 15/00* (2006.01)

(52) U.S. Cl.
CPC ........ *G03F 7/70308* (2013.01); *G02B 27/0043* (2013.01); *G02B 15/00* (2013.01); *G02B 27/0025* (2013.01); *G03F 7/70266* (2013.01)
USPC ................ 355/55; 355/67; 355/77; 359/670; 359/676; 359/694; 359/697; 359/703

(58) Field of Classification Search
CPC .... G02B 15/00; G02B 15/14; G02B 27/0025; G02B 27/0043; G02B 27/0068; G03F 7/70191; G03F 7/70266; G03F 7/70308
USPC .......... 355/55, 67, 71, 77; 359/663, 670, 676, 359/694, 696, 697, 703
See application file for complete search history.

(56) References Cited

U.S. PATENT DOCUMENTS

| 4,676,631 | A | 6/1987 | Kosugi et al. |
| 4,769,680 | A | 9/1988 | Resor, III et al. |
| 5,557,469 | A | 9/1996 | Markle et al. |
| 6,043,863 | A * | 3/2000 | Ikeda .............................. 355/53 |
| 6,088,080 | A * | 7/2000 | Itoh ................................ 355/30 |
| 6,295,118 | B1 | 9/2001 | Takeuchi |
| 2002/0149756 | A1 | 10/2002 | Tokuda et al. |
| 2003/0095342 | A1 | 5/2003 | Matsumoto et al. |
| 2005/0041230 | A1 | 2/2005 | Otsuka |

FOREIGN PATENT DOCUMENTS

| EP | 1835527 A1 | 9/2007 |
| GB | 2138163 | 10/1984 |
| JP | 2005-292450 | 10/2005 |

OTHER PUBLICATIONS

JP2005-292450 Machine translation.
JP2012-539944 Grounds for Rejection.

* cited by examiner

*Primary Examiner* — Colin Kreutzer
(74) *Attorney, Agent, or Firm* — Timothy M Schaeberle (57) ABSTRACT

In a lithographic projection system, a corrective optic in the form of one or more deformable plates is mounted within telecentric image or object space for making one-dimensional or two-dimensional adjustments to magnification. The deformable plate, which can be initially bent under the influence of a preload, contributes weak magnification power that influences the magnification of the projection system by changing the effective focal length in object or image space. An actuator adjusts the amount of curvature through which the deformable plate is bent for regulating the amount of magnification imparted by the deformable plate.

8 Claims, 5 Drawing Sheets

MAGNIFICATION CONTROL FOR LITHOGRAPHIC IMAGING SYSTEM

CROSS-REFERENCE TO RELATED APPLICATIONS

This application claims the benefit of priority under 35 U.S.C. §119(e) of U.S. Provisional Application Ser. No. 61/263,178 filed on U.S. Nov. 20, 2009.

TECHNICAL FIELD

The invention concerns the lithographic projection of patterns onto substrates for such purposes as the manufacture of semiconductor devices or integrated circuits including flat panel displays and particularly concerns the management of the magnification of the projected patterns.

BACKGROUND OF THE INVENTION

Microlithographic projection systems project patterns onto substrates for selectively exposing photosensitive layers at multiple stages during the manufacture of microcircuits and microdevices. Often, the patterns must be stitched together to expose extended areas or registered with underlying patterns to build the desired circuits or devices. Image magnification of the projected patterns must be finely controlled to compensate for variations in operating conditions, such as changes in ambient temperature or pressure, to properly relate the patterns in successive exposures. Stepped lithography, which requires the stitching together of adjacent patterns, generally requires magnification control in two orthogonal directions within the image plane of the projection system. Scanning lithography, which regulates exposure times in the scanning direction, generally requires magnification control in only one direction that is orthogonal to the scan direction.

Magnification control is typically administered by relatively translating either (a) an object conjugate (e.g., reticle) to vary a ratio of object to image distances or (b) an object field lens to relatively vary a ratio of corresponding focal distances. Both approaches require the projector systems to be non-telecentric in object space so that the component shifts change magnification. However, the same projection systems are required to be telecentric in image space so that small shifts in focus to not affect the magnification of the projected image. Illumination and projection systems combined under conditions of partial coherence further complicate the angular distribution of rays in object space required to maintain telecentricity in the image space. As a result, the component shifts within object space can, in addition to changing magnification, also distort the images projected into image space or produce wavefront aberrations. A combination of counteracting component shifts can be required to make magnification corrections with a minimum of distortion. Projection systems with telecentric object space have used corrective optics with specially shaped surfaces, variations in air pressure between lens components, and variations in beam frequency for adjusting combinations of magnification and distortion.

SUMMARY OF THE INVENTION

The invention, which is particularly applicable to doubly telecentric lithographic projection systems, features a corrective optic in the form of one or more deformable plates for making one-dimensional or two-dimensional adjustments to magnification (e.g., anamorphic magnification adjustments or radially symmetric magnification adjustments). The deformable plate contributes weak magnifying power that influences the magnification of the projection system by changing the effective focal length in object or image space. An actuator adjusts the amount of curvature through which the deformable plate is bent for regulating the amount of magnification imparted by the deformable plate.

Preferably, the deformable plate remains under a constant overall direction of loading throughout the predetermined range of curvature variation so that the deformable plate is continuously adjustable throughout the range. For example, the deformable plate can be initially preloaded and the subsequent loads on the deformable plate can increase or decrease with respect to the initial preload, but within its range of preferred operation, the plate is not allowed to transition through a relaxed state. The projection system is preferably designed to accommodate the initially curved condition of the deformable plate under preload and its associated contribution to the magnifying power of the projection system.

Changes in magnification associated with the operation of the projection system can be monitored indirectly by measuring changes in temperature or pressure in or around the projection system or directly by measuring the size of the projected pattern. A controller controls the actuator to change the curvature of the deformable plate and thereby compensate for the monitored changes in magnification.

One version of the invention as a magnification adjustable lithographic projection system includes a telecentric imaging system having a telecentric object or image space and a deformable plate located within the telecentric object or image space for contributing a limited amount of magnification power to the telecentric imaging system as a function of an amount of curvature of the deformable plate. An actuator adjusts the curvature of the deformable plate through a range of curvature variation for adjusting a magnification of the imaging system.

Preferably, the actuator provides for both increasing and decreasing curvature of the deformable plate with respect to the initially curved condition of the deformable plate. In addition, the deformable plate preferably remains under a constant overall direction of loading throughout the range of curvature variation. The actuator can be arranged to preload the deformable plate in the initially curved condition. The telecentric imaging system can be designed to a nominal state that incorporates a certain amount of magnification power imparted by the deformable plate in its initially curved condition.

The deformable plate preferably has an optical axis coincident with the optical axis of the imaging system in which it is mounted. For purposes of anamorphic magnification adjustment, the deformable plate is preferably bent around a single transverse axis that extends normal to the common optical axis of the deformable plate and imaging system. As such, the deformable plate can be arranged to contribute a weak amount of cylindrical magnification power.

The deformable plate can be a first of a plurality of deformable plates that are deformable through a predetermined range of curvature variation for adjusting a magnification of the imaging system. Each of the deformable plates preferably remains under a constant overall direction of loading throughout the predetermined range of curvature variation. The actuator can be one of a plurality of actuators for bending the deformable plates in at least two different directions, or the actuator can collectively deform the plurality of deformable plates in the same or different directions. For example, one deformable plate can be bent about a first transverse axis and another deformable plate can be bent about a second transverse axis. For purposes of increasing magnification power, the first and second transverse axes of the deformable plates can be oriented in parallel. For purposes of providing radially symmetric magnification adjustments, the first and second transverse axes of the deformable plates can be oriented orthogonally and both deformable plates can contribute equal amounts of magnification power. For purposes of anamorphic magnification adjustments, the deformable plates can contribute different amounts of magnification power or can be oriented about non-orthogonal axes.

Another version of the invention involves a magnification corrector for a lithographic projection system. A deformable plate is preloaded in an initially curved condition. An actuator relatively increases and decreases the curvature of the deformable plate through a range of curvatures with respect to the nominal curvature. The deformable plate remains under a constant overall direction of loading throughout the predetermined range of curvature variation.

The actuator preferably preloads the deformable plate in the initially curved condition. The preferred deformable plate, which can have a nominal radius of curvature of greater than 10 meters, has anterior and posterior surfaces that are bent about a transverse axis such that one of the anterior and posterior surfaces is under compression in the initially curved condition and the other of the anterior and posterior surfaces is under tension in the initially curved condition. In addition, one of the surfaces remains under compression and the other of the surfaces remains under tension throughout the predetermined range of curvature variation.

If the initially curved condition of the deformable plate departs from a nominal circular arcuate shape, an optical thickness of the plate can be varied to compensate for the departure from the nominal circular arcuate shape to avoid producing distortion in the imaging system. The deformable plate can include an optical region for transmitting light through the projection system and a mounting region in engagement with the actuator for imparting bending loads to the deformable plate. The actuator engages the mounting region of the deformable plate for imparting bending loads to the deformable plate. For example, the actuator can include rotatable elements in engagement with the mounting region for imparting bending moments to the deformable plate.

Alternatively, the deformable plate can be sealed together with a backing plate forming a sealed cavity between the deformable plate and the backing plate and the actuator regulates pressure within the sealed cavity for deforming the deformable plate through a predetermined range of curvature variation. Also possible, the deformable plate can have an orientation that subjects the deformable plate to deformation under a force of gravity. The actuator adjustably supports the deformable plate through different spans for deforming the deformable plate through the predetermined range of curvature variation. Either anamorphic or radially symmetric distortion can be effected by forces acting generally over the exposed surfaces of the deformable plates depending at least in part on the placement of the supports for the deformable plates. For example, parallel supports can be used for adjusting cylindrical magnification power and radially symmetric supports can be used for adjusting spherical magnification power.

Another version of the invention involves a method of adjusting magnification of a lithographic projection system. A deformable plate is mounted within a telecentric object or image space of the lithographic projection system. Magnification changes of the projection system are monitored, and the curvature of the deformable plate is adjusted through a predetermined range of curvature variation to compensate for the monitored changes in the magnification of the projection system.

Preferably, the deformable plate is preloaded for imparting an initial amount of curvature to the deformable plate for contributing a limited amount of magnification power to the projection system. In one or more of its various forms, the invention (a) provides independent control over magnification in two orthogonal directions, (b) has minimal impact on aberrations of imaging systems, (c) requires relatively simple mechanics for operation, (d) allows for precisely matching optical imaging systems from one lithographic tool to another, and (e) allows for precisely matching multiple optical systems within a single lithographic tool.

The projection system is preferably designed to incorporate the limited amount of magnification power imparted by the deformable plate in the preloaded condition. Preferably, the deformable plate is maintained under a constant overall direction of loading throughout the predetermined range of curvature variation.

DETAILED DESCRIPTION OF THE INVENTION

Figure 1:
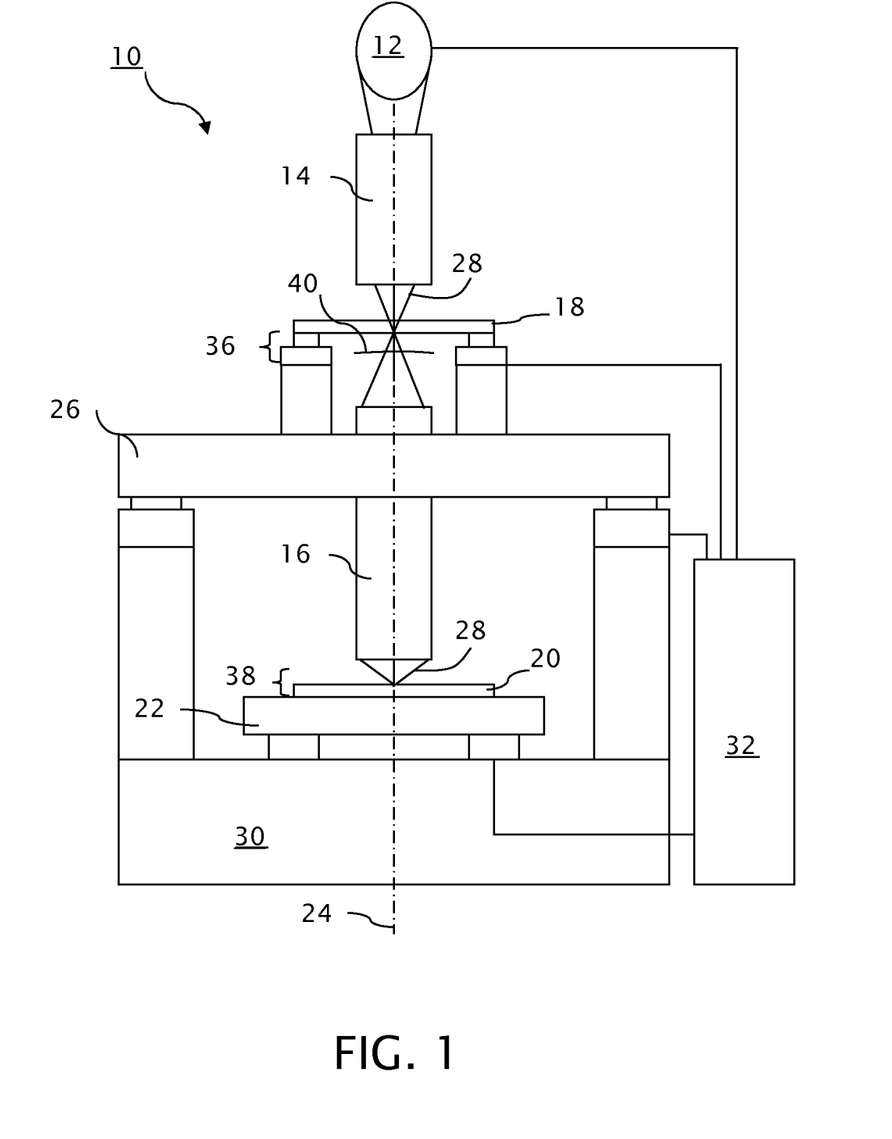
FIG. 1 is a diagram of a lithographic projection system with a deformable plate within telecentric object space for purposes of magnification adjustment.

A microlithographic projection system (tool) 10, as an example of a projection system capable of benefitting from the invention, includes a light source 12, an illuminator 14, and a projection lens 16 for projecting an image of a reticle 18 onto a substrate 20. A horizontal X-Y-axis stage 22, which is translatable in two orthogonal directions normal to a common optical axis 24 of the illuminator 14 and the projection lens 16, provides for relatively moving the substrate 20 with respect to the projection lens 16 for exposing successive areas of the substrate 20. A vertical Z-axis stage 26 provides for relatively translating the projection lens 16 with respect to the substrate 20 along the optical axis 24 to provide for appropriately focusing the image of the reticle 18 onto the substrate 20.

The light source 12 emits radiation in the form of a beam of light 28 appropriate for developing the photosensitive substrate 20. A variety of known devices can be used to for the light source 12 including a lamp source, such as a high-pressure mercury arc lamp targeting certain spectral lines, or a laser source, such as an excimer laser, particularly for operating within the deep ultraviolet spectrum.

The illuminator 14 provides for shaping and spatially distributing the light beam 28 and targeting angular and spatial irradiance profiles set for both the pupil and image plane of the projection lens, the latter coinciding with the substrate 20. Although not shown in detail in FIG. 1, typical illuminators for microlithographic operations include a profiler for collecting and shaping the beam 28, a uniformizer (e.g., a kaleidoscope or fly's eye array) for integrating the light into a uniform irradiance field, and a relay lens for relaying an image of the output of the uniformizer to the reticle 18, where an image plane of the illuminator 14 coincides with an object plane of the projection lens 16.

The projection lens 16, which preferably has an entrance numerical aperture larger than an exit numerical aperture of the illuminator 14 for providing partial coherent imaging, projects an image of the reticle 18 onto the substrate 20. That is, a pupil (not shown) of the projection lens 16, which is typically conjugate to a pupil (also not shown) in the illuminator 14, is preferably underfilled by the image of the illuminator pupil but is sized to collect angularly divergent light from illuminated features of the reticle 18 to produce a high resolution image of the reticle 18 on the substrate 20. The projected image of the reticle 18 can be enlarged or reduced as required. The projection lens 16 can include reflective or diffractive elements as well as refractive elements or combinations of such elements, such as in catadioptric optics.

The reticle 18, also referred to as a "mask", includes one or more patterns intended for projection onto the substrate 20 and can be sized within or beyond the field captured by the projector lens 16. Reticles with larger patterns can be relatively translated with respect to the projection lenses to expose different parts of the reticle patterns in succession.

The photosensitive substrate 20 generally takes the form of a flat plate, such as a semiconductor wafer or glass panel treated with a photoresist to react to exposures of light. Often, the entire substrate 20 cannot be imaged at once, so the horizontal X-Y-axis translational stage 22 on a base 30 provides for translating the substrate 20 through a range of positions for collectively illuminating a desired working area of the substrate 20. The projection lens 16 is supported on the vertical Z-axis translational stage 26 above the base 30 for adjusting the image distance of the projection lens 16 from the substrate 20 along the optical axis 24. A controller 32 coordinates relative motions among the projection lens 16, the reticle 18, and the substrate 20 as well as the exposure of the projection system 10.

A deformable plate 40 is located adjacent to the reticle 18 within a telecentric object space 36 of the projection lens 16. The deformable plate 40 is preloaded into an initially deformed condition, which contributes a limited amount of magnification power to the projection lens 16. As such, projection lens 16, including the prescriptions of its other components, is designed to compensate for the limited magnification power contribution of the deformable plate in its initially deformed (preloaded) condition to preserve a nominally desired magnification of the projection lens 16. Although shown in telecentric object space 36, the deformable plate 40 could also be located in telecentric image space 38 adjacent to the substrate 20. The choice can be made largely on the basis of space and access considerations. In either or both locations, the deformable plate can the control magnification in a lithographic system that is telecentric in both image and object space.

Figure 2:
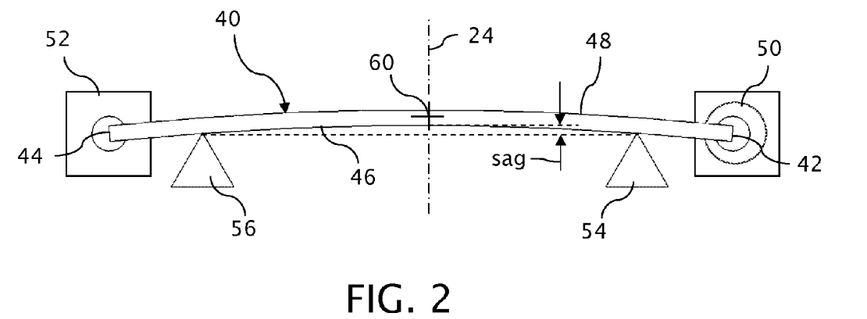
FIG. 2 is a side view of the deformable plate in a preloaded condition and showing depicting apparatus for preloading and otherwise bending the plate

FIG. 2 shows the deformable plate 40 in an initially deformed (preloaded) condition bent about a single transverse axis 60. The preload is generated by an actuator 50 acting at one end 42 of the deformable plate 40 through a pair of fulcrum supports 54 and 56 and an anchor 52 at the other end 44. The deformation places an anterior surface 46 of the deformable plate 40 in compression and a posterior surface 48 of the deformable plate 40 in compression.

Prior to preloading, the deformable plate 40 is preferably a thin plane-parallel plate with the anterior and posterior surfaces 46 and 48 both flat and parallel. The deformable plate 40 is preferably made of optical glass in either an amorphous or crystalline form to provide for the transmission of light without generating unnecessary wavefront aberrations or departures from uniformity. The deformable plate 40 is also made thin enough in relation to its length between ends 42 and 44 to effect the desired bending. For example, a plate having an overall length of 90 millimeters is preferably 5 millimeters or less in thickness.

In its preloaded condition, the deformable plate 40 is preferably only slightly bent so that any induced wavefront aberrations are negligible. Preferably, the deformable plate is preloaded to an initially curved condition with a nominal curvature of less than 0.1 meters. However, the deformable plate 40 is sufficiently bent in its preloaded condition to accommodate a range of bending that includes both partially unloading and further loading the deformable plate 40 to provide a corresponding range of magnification adjustment from lesser magnification to greater magnification. Thus, the deformable lens 40 is not adjusted from or into an unloaded condition to avoid instabilities associated with transitions between loaded and unloaded conditions of the deformable lens 40.

Figure 3:
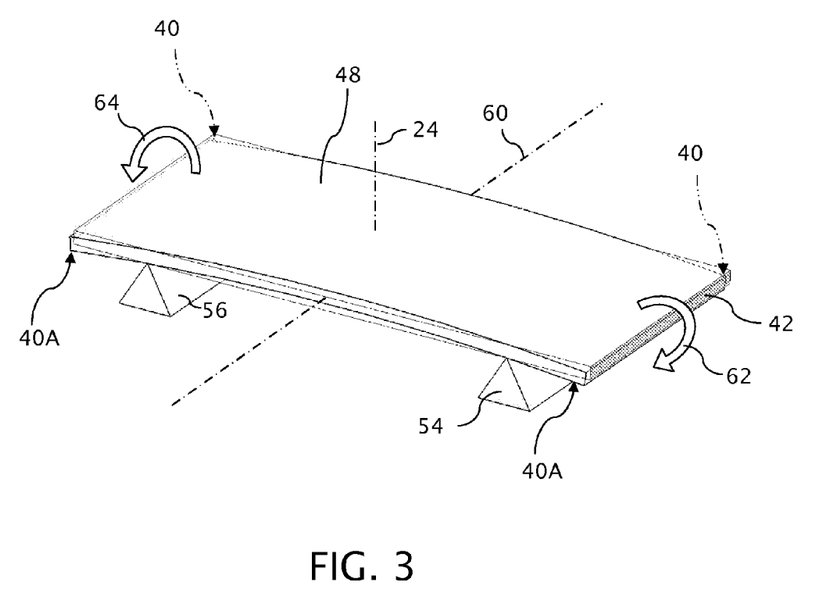
FIG. 3 is a perspective view of the deformable plate depicting the plate in both its preloaded and further bent conditions in an overall cylindrical form.

FIG. 3 shows the deformable plate 40 being bent from the initially bent (preloaded) condition (shown in phantom) to a further bent condition designated 40A as imposed by moments 62 and 64 produced by the actuator 50 between each end 42 and 44 and the respective fulcrum supports 54 and 56. The further bending about the transverse axis 60 produces an anamorphic change in magnification in one orthogonal direction of the image field at the substrate 20. The moments 62 and 64 can be imposed by linear or angular displacements of the ends 42 and 44.

The table reproduced below illustrates the sensitivity of deformable plates of different thickness, all having a length of approximately 90 millimeters (mm). The abbreviation "μm" refers to microns, the abbreviation "mm" refers to millimeters, the abbreviation "m" refers to meters, the abbreviation "ppm" refers to parts per million, and the abbreviation "deg" refers to degrees. A measure of "sag" is illustrated in FIG. 2.

|  | thickness of the bent plate (mm) | | |
|---|---|---|---|
|  | 1.25 | 2.5 | 5 |
| sag for 20 ppm (um) | 29.4 | 14.7 | 7.3 |
| radius of curvature (m) | 20.0 | 39.9 | 79.9 |
| max slope or tilt at edge of plate (deg) | 0.006 | 0.012 | 0.025 |

As illustrated by the table, both the bending range and sensitivity of the bent plate varies approximately linearly with the thickness of the plate. A more direct comparison is made in the table below comparing a 2.5 millimeter (mm) thick plate to a 5.0 millimeter (mm) thick plate, each made of fused silica and having a common target magnification.

|  | Plate Thickness | |
| --- | --- | --- |
|  | 2.5 mm | 5.0 mm |
| Sag | 14.683 μm | 7.342 μm |
| Radius of Cylinder | 39945.7 mm | 79887.1 mm |

Less bending is required for plates of increased thickness to achieve the same range of magnification adjustment. However, the thicker plates, particularly those substantially greater than 5.0 mm in thickness are more difficult to bend and can produce other unintended effects.

A relatively pure magnification change accompanying a cylindrical distortion of the plates can be derived by considering how a tilted plate laterally deviates the telecentric rays. The deviation is a function of the tilt, thickness, and refractive index of the plate. The telecentric rays are the rays that pass through the center of the aperture stop of the imaging lens and are parallel in the telecentric image or object space. A plate bent in a cylindrical shape can be considered on a localized level as a plurality of individually tilted plates whose tilt increases by a sine function with distance from the optical axis, and the relationship between ray deviation and distance from the optical axis is highly linear for small bends. This linearity means that (a) the deviations are proportional to the distance from the optical axis and (b) the deviations have predominately changed only the magnification of the image in the direction of the bend and not the distortion.

As an example, if a plate is bent cylindrically, such that the maximum angle of incidence is one degree at the edge of the telecentric rays, then the distortion (i.e., departure from a linear deviation) is approximately 1:15,000 of the magnification. If the maximum angle of incidence is 2 degrees at the edge of the telecentric rays, then the ratio distortion to magnification changes by a factor of 4 to 1:3,750. Thus, the magnification effects of a bent plate in telecentric plate clearly dominate any distortion effects, particularly at small amounts of plate curvature.

Figure 4:
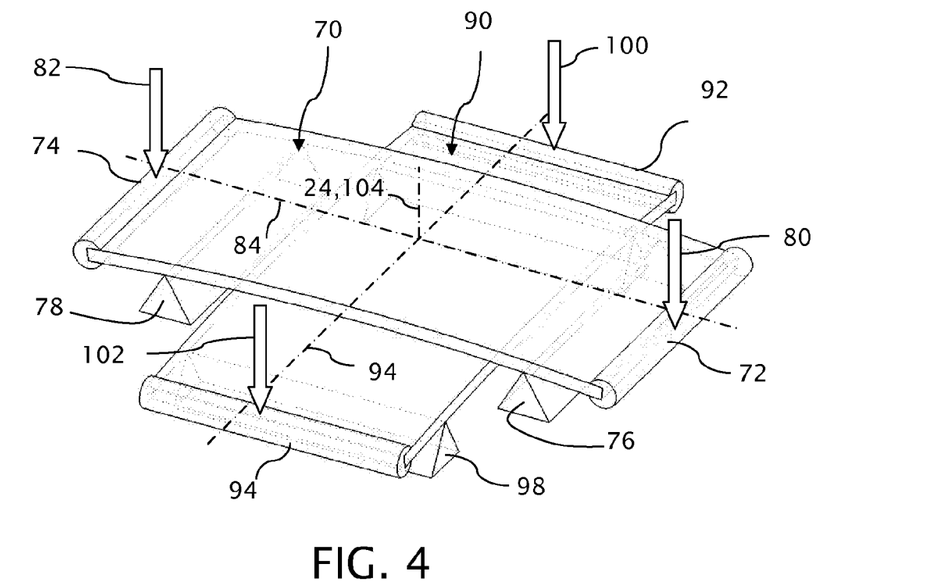
FIG. 4 is a perspective view of two overlapping deformable plates each arranged for bending in a different orthogonal direction.

FIG. 4 depicts a pair of deformable plates 70 and 90 arranged for providing magnification corrections in two orthogonal directions. Actuators 80 and 82, which are schematically depicted as arrows, act on opposite ends 72 and 74 of the deformable plate 70 against fulcrums 76 and 78 for generating opposing moments resulting in the bending of the deformable plate 70 about transverse axis 84. Similarly, actuators 100 and 102, which are also depicted as arrows, act on opposite ends 92 and 94 of the deformable plate 90 against fulcrums 96 and 98 for generating opposing moments resulting in the bending of the deformable plate 90 about transverse axis 94, which extends orthogonal to the transverse axis 84. Both axes 84 and 94 preferably extend normal to the optical axes 104 of the deformable plates 70 and 90 as well as the optical axis 24 of the imaging system in which the plates 70 and 90 are mounted. Together, the deformable plates 70 and 90 can produce a range of anamorphic magnification adjustments by relatively adjusting the relative magnitude of adjustments contributed by each of the plates 70 and 90 or by adjusting the relative angular positions of their axes 84 and 94. A uniform magnification adjustment (i.e., a radially symmetric magnification adjustment) at the substrate 20 can be provided by making equal magnification adjustments with the two plates 70 and 90 about their orthogonal axes 84 and 94. Preferably, one of the two orthogonal axes 84 or 94 over which magnification control is exercised corresponds to an intended direction for stepping or scanning the projection lens 16 across the substrate 20.

Figure 5:
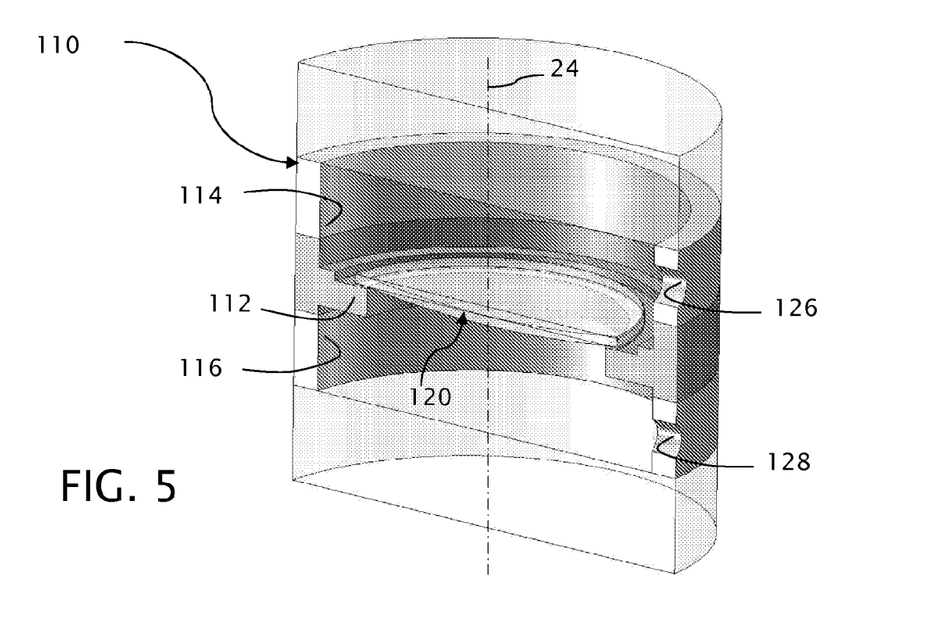
FIG. 5 is a cross-sectional perspective view of a sealable lens barrel for mounting a deformable plate between two independently controllable pressure chambers for spherically deforming the plate.

FIG. 5 depicts in cross section a sealed lens barrel 110 for mounting a deformable plate 120 within pressure controlled environment. The deformable plate 120 rests on an annular seat 112, which functions similar to the fulcrums of the preceding plate mounting systems, and when seated, divides the sealed lens barrel 110 into two independently controllable pressure chambers 114 and 116. An inert gas, such as nitrogen, is pumped through respective apertures 126 and 128 for adjusting a pressure differential between the two chambers 114 and 116. Higher pressure in the upper chambers 114 pushes the deformable plate 120 against the annular seat 112 and symmetrically deforms the deformable plate 120 for producing a uniform magnification adjustment across the substrate 20. Preferably, a pressure differential is maintained even at a nominal operating condition for the projection lens 16 so that the deformable plate 120 remains deformed in a given direction throughout an intended range of magnification adjustment.

The deformable plates 40, 70, and 90 of the preceding embodiments are preferably bent into a cylindrical form and the deformable plate 120 is preferably bent into a spherical form for adjusting magnification within either the telecentric object space 36 or the telecentric image space 38 of the projection lens 16 to correct or otherwise adjust magnification while limited unwanted wavefront aberrations or distortions. Predictable or measurable departures from the desired cylindrical or spherical forms can be minimized by adjusting the bending forces or compensated for by varying the thickness from the center to the peripheries of the deformable plates or making other adjustments outside the optical zones of the plates for achieving the desired bending performance. In addition, the deformable plates 40, 70, and 90 can be laterally displaced so that center of curvature of the plates remains centered along the optical axis 24 of the projection lens 16

Figure 6:
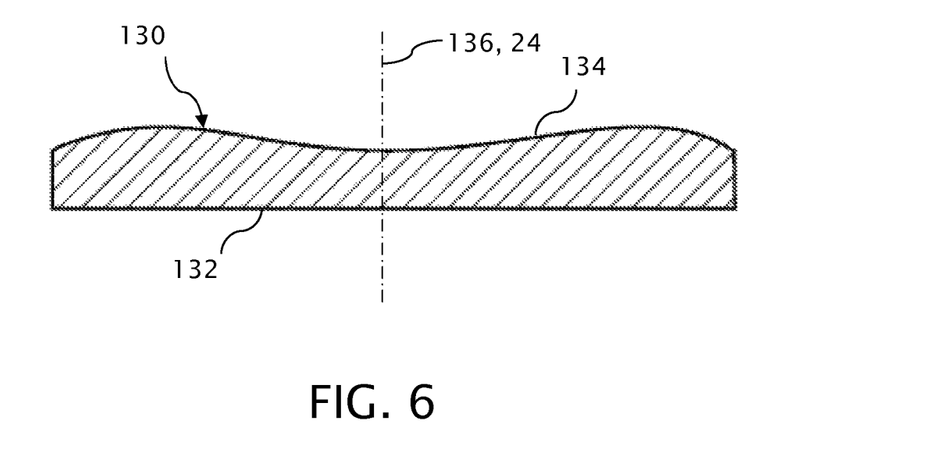
FIG. 6 is a cross-sectional view depicting a deformable plate having an aspheric surface and a varying thickness to compensate for bending forces that would otherwise distort the plate out of a desired form such as a cylindrical or spherical form.

A deformable plate 130 is depicted in FIG. 6 with radial variation in thickness, which is greatly exaggerated for purposes of illustration. An anterior surface 132 of the deformable plate 130 is depicted as flat, but a posterior surface 134 of the deformable plate 130 is depicted as having an aspheric surface. While symmetrical about an optical axis 136 of the deformable plate, the variation in thickness is intended to compensate for bending forces that are not distributed so as to otherwise result in a cylindrical or spherical shape for the deformable plate 130. More particularly, the variation in thickness is intended to result in a more nearly cylindrical or spherical shape for the deformable plate 130 in the intended preloaded condition of the deformable plate. Although the just the posterior surface 134 of the deformable plate 130 has an aspheric surface, either or both of the anterior and posterior surfaces 132 and 134 can be formed with aspheric surfaces so that both surfaces 132 and 134 assume more nearly cylindrical or spherical shapes in the preloaded condition.

Figure 7:
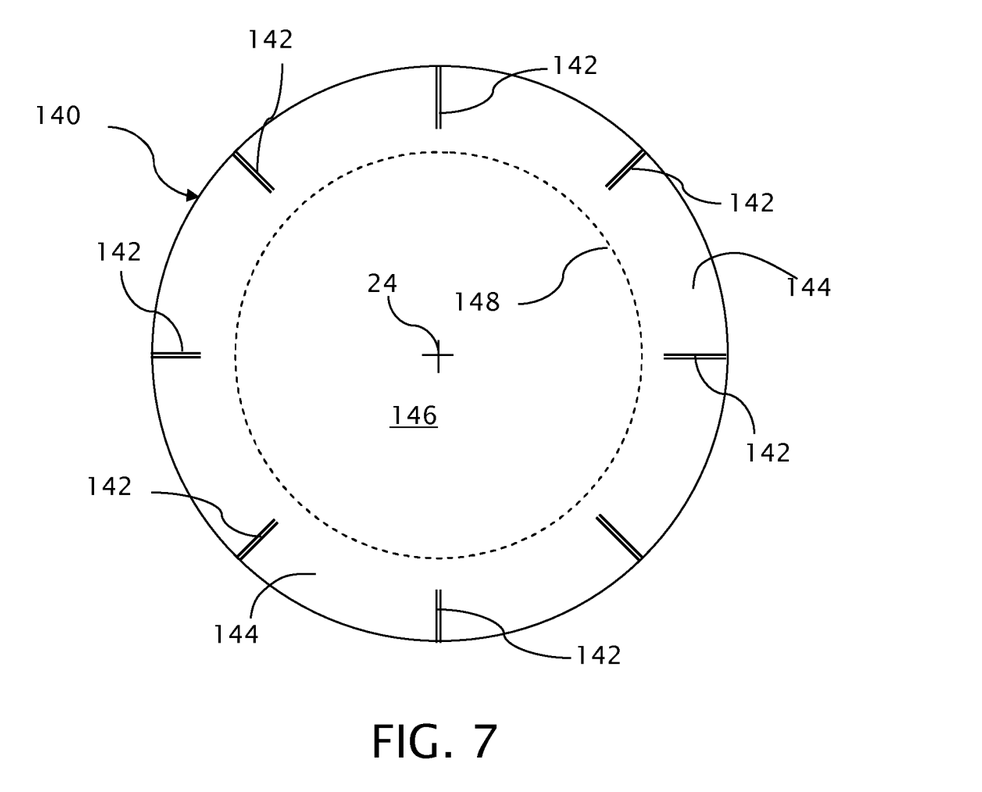
FIG. 7 is a plan view of a deformable plate having slots within a mounting surface of the plate to facilitate bending the plate into a spherical form.

In FIG. 7, a deformable plate 140 is formed with slots 142 formed in a mounting region 144 of the deformable plate 140, which is outside an optical region 146 of the plate 140 as indicated by an optical boundary line 148. Bending loads for deforming the deformable plate 140 are applied in the mounting region 144 and outside the optical region 146 to avoid interfering with the intended optical performance of the deformable plate. Since the mounting region 144 is not part of the optical system of the projection lens 16 other modifications, including the introduction of the slots 142 or the incorporation of structures for engaging or transmitting forces from the actuator (not shown) can be provided within the mounting region 144.

Not only do the deformable plates exploit telecentric space within projection lenses for adjusting magnification independently of other optical considerations, the deformable plates enable doubly telecentric projection lenses to be adjusted for magnification within a telecentric object space. Other components within the projection lenses including reticles and lens elements, which otherwise require adjustment to carry out magnification adjustments can remain fixed. In addition, the doubly telecentric projections lenses, which are equally telecentric in both image and object space, can be designed with more symmetric components to reduce sources of wavefront errors. Of course, some departure from theoretical telecentricity is evident in any practical optical design, and the tolerance for telecentricity is preferably set so that any unwanted distortion accompanying the intended range of magnification adjustments remains within design limits.

Figure 8:
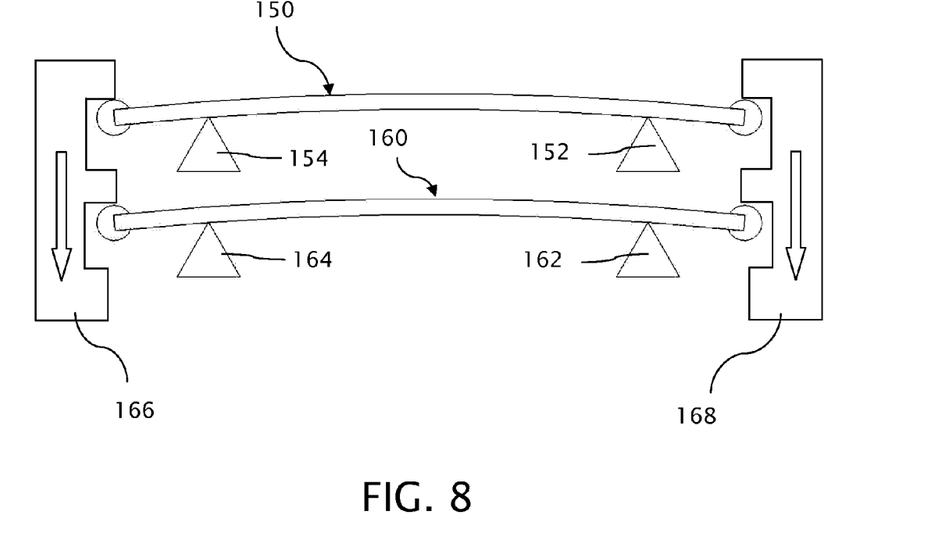
FIG. 8 is a side view of a pair of deformable plates that are simultaneously deformed into desired shapes by a common actuator.

FIG. 8 illustrates the collective operation of compound deformable plates 150 and 160 that are deformable together for producing greater amounts of magnification adjustment or such greater amounts of magnification adjustment with thinner plates. Although separately supported on respective fulcrum pairs 152, 154, and 162, 164, actuators 166 and 168 provide for deforming both of the plates 150 and 160 together. Additional deformable plates can be stacked together for making even greater changes to magnification in one or both orthogonal directions. For spherically deforming the plates 150 and 160, each of the fulcrum pairs 152, 154, and 162, 164 can represent respective annular seats for supporting the plates 150 and 160 and the actuators 166 and 168 can be parts of a common annular compression ring for engaging the plates 150 and 160 about their respective circumferences.

The various actuators 50, 52, 80, 82, 100, 102, 114, 116, 166, 168 of the preceding embodiments can be connected to the controller 32 for making continuous, intermittent, or otherwise automatic corrections to magnification associated with the operation of the lithographic projection system 10. Control systems for making automatic magnification adjustments are well known. For example, sensors (not shown) for monitoring operating conditions of the projection system 10 or the substrate 20 can be arranged to provide information to the controller for predicting responses of the projection system 10 or the substrate 20 requiring magnification adjustments, or other instruments can be used for more directly monitoring the magnification of the projection lens 16, such as by measuring the size of imaged gauge features, to provide the controller 32 with information for controlling the actuators. Continuous closed loop adjustment of magnification is preferred for most lithographic systems.

Although depicted with respect to a lithographic projection system designed to project an image of a reticle 18 onto a substrate 20, the invention is also directly applicable to lithographic projection systems in with the patterns intended for projection are formed by spatial light modulators. The deformable plates are locatable adjacent the object or image conjugates, including in the object space adjacent to the output of a microlens array for producing the pattern intended for projection onto a substrate.

The telecentric image and object space of the telecentric lithographic projection systems gradually transitions into pupil space with distance from the object and image conjugates. Preferably, the deformable plates are located as closely as possible to one or the other of the image conjugates to avoid aberration of the imaging system but benefits of the invention can be obtained by locating the deformable plates elsewhere within primarily image or object space where the instantaneous pupil of a point in the image or object field (i.e., the aperture of the cone of light extending from the field point) is substantially smaller than the clear aperture, and preferably one-fourth or less.

The invention claimed is:

1. A magnification adjustable lithographic projection system comprising:
    a telecentric imaging system having a telecentric object or image space,
    a deformable plate located within the telecentric object or image space for contributing a limited amount of magnification power to the telecentric imaging system as a function of an amount of curvature of the deformable plate,
    an actuator that adjusts the curvature of the deformable plate through a range of curvature variation for adjusting a magnification of the imaging system,
    the deformable plate being a first of a plurality of deformable plates that are deformable through ranges of curvature variation for adjusting a magnification of the imaging system,
    the first of the plurality of plates being adjustable about a first transverse axis that extends substantially normal to an optical axis of the telecentric imaging system, and
    a second of the plurality of plates being adjustable about a second transverse axis that extends substantially normal to the optical axis of the telecentric imaging system,
    wherein the first and second transverse axes extend in parallel for providing a cumulative anamorphic magnification adjustment.

2. A magnification adjustable lithographic projection system comprising:
    a telecentric imaging system having a telecentric object or image space,
    a deformable plate located within the telecentric object or image space for contributing a limited amount of magnification power to the telecentric imaging system as a function of an amount of curvature of the deformable plate,
    an actuator that adjusts the curvature of the deformable plate through a range of curvature variation for adjusting a magnification of the imaging system,
    the deformable plate being a first of a plurality of deformable plates that are deformable through ranges of curvature variation for adjusting a magnification of the imaging system,
    the first of the plurality of plates being adjustable about a first transverse axis that extends substantially normal to an optical axis of the telecentric imaging system, and
    a second of the plurality of plates being adjustable about a second transverse axis that extends substantially normal to the optical axis of the telecentric imaging system,
    wherein the actuator collectively deforms the plurality of deformable plates in a common direction.

3. A magnification corrector for a lithographic projection system comprising:
    a deformable plate preloaded in an initially curved condition with a nominal curvature,
    an actuator for increasing and decreasing the curvature of the deformable plate through a range of curvatures with respect to the nominal curvature,
    the deformable plate remaining under a constant overall direction of loading throughout the range of curvatures, the deformable plate having anterior and posterior optical surfaces that are bent about an axis such that one of the anterior and posterior optical surfaces is under compression in the initially curved condition and the other of the anterior and posterior optical surfaces is under tension in the initially curved condition, and at least one of the anterior and posterior optical surfaces being formed with an aspheric surface so that the at least one anterior and posterior optical surface assumes a more nearly cylindrical or spherical shape in the initially curved condition.

4. The corrector of claim 3 in which the actuator preloads the deformable plate in the initially curved condition.

5. The corrector of claim 3 in which the one of the anterior and posterior optical surfaces remains under compression and the other of the anterior and posterior optical surfaces remains under tension throughout the range of curvature variation.

6. The corrector of claim 3 in which both of the anterior and posterior optical surfaces are formed with aspheric surfaces to avoid producing distortion in the imaging system.

7. The corrector of claim 3 in which the deformable plate is sealed together with a backing plate forming a sealed cavity between the deformable plate and the backing plate, and the actuator regulates pressure within the sealed cavity for deforming the deformable plate through the range of curvature variation.

8. The corrector of claim 3 in which the deformable plate has an orientation that subjects the deformable plate to deformation under a force of gravity and the actuator adjustably supports the deformable plate through different spans for deforming the deformable plate through the range of curvature variation.

\* \* \* \* \*